(12) United States Patent
Inukai

(10) Patent No.: US 7,916,162 B2
(45) Date of Patent: Mar. 29, 2011

(54) LIGHT OUTPUT DEVICE AND IMAGE FORMING APPARATUS INCLUDING THE LIGHT OUTPUT DEVICE

(75) Inventor: Katsumi Inukai, Iwakura (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 123 days.

(21) Appl. No.: 12/412,440

(22) Filed: Mar. 27, 2009

(65) Prior Publication Data

US 2009/0296763 A1    Dec. 3, 2009

(30) Foreign Application Priority Data

Jun. 2, 2008  (JP) .................... 2008-144765

(51) Int. Cl.
*B41J 2/435* (2006.01)
*B41J 2/47* (2006.01)
(52) U.S. Cl. ........................ 347/237; 347/247
(58) Field of Classification Search .................. 347/128, 347/132, 133, 135, 236, 237, 246, 247
See application file for complete search history.

(56) References Cited

U.S. PATENT DOCUMENTS

| | | | |
|---|---|---|---|
| 4,890,288 A | 12/1989 | Inuyama et al. | |
| 5,151,910 A | 9/1992 | Inuyama et al. | |
| 5,973,719 A * | 10/1999 | Araki et al. | 347/253 |
| 5,986,687 A * | 11/1999 | Hori | 347/246 |
| 6,350,978 B1 | 2/2002 | Kasai | |
| 6,466,594 B1 * | 10/2002 | Iwazaki | 372/29.01 |
| 6,549,265 B1 | 4/2003 | Sakakibara et al. | |
| 7,136,404 B2 * | 11/2006 | Suda | 372/29.015 |
| 7,359,414 B2 * | 4/2008 | Ikeda et al. | 372/38.07 |
| 7,446,793 B2 * | 11/2008 | Inagawa et al. | 347/236 |

FOREIGN PATENT DOCUMENTS

| | | |
|---|---|---|
| JP | 63-056059 A | 3/1988 |
| JP | 3-110583 A | 5/1991 |
| JP | 5-091272 A | 4/1993 |
| JP | 07-074419 | 3/1995 |
| JP | 2000-307188 A | 11/2000 |
| JP | 2000-332345 | 11/2000 |
| JP | 2001-088344 | 4/2001 |
| JP | 2003-069139 | 3/2003 |
| JP | 2007-042795 | 2/2007 |

* cited by examiner

*Primary Examiner* — Hai C Pham
(74) *Attorney, Agent, or Firm* — Banner & Witcoff, Ltd.

(57) ABSTRACT

A light output device includes: an output unit including a light source; a control voltage generation unit that detects output power of the light source, and generates a control voltage for controlling a drive current of the light source; a control unit that sets a target value of the output power; a voltage-current conversion unit that converts the control voltage into the drive current; a setting unit that sets an inclination of a characteristic line of control voltage-drive current conversion in the voltage-current conversion unit; and an adjustment unit that adjusts the voltage-current conversion unit such that the drive current becomes a target current value for setting the output power to the target value in a predetermined control voltage value on the characteristic line, wherein the setting unit sets the inclination of the characteristic line to a first inclination where the drive current does not reach a maximum current value.

12 Claims, 11 Drawing Sheets

LIGHT OUTPUT DEVICE AND IMAGE FORMING APPARATUS INCLUDING THE LIGHT OUTPUT DEVICE

CROSS REFERENCE TO RELATED APPLICATION

The present application claims priority from Japanese Patent Application No. 2008-144765, which was filed on Jun. 2, 2008, the disclosure of which is herein incorporated by reference in its entirety.

TECHNICAL FIELD

Devices and apparatuses consistent with the present invention relate to a light output device and an image forming apparatus including the light output device, and more particularly, to control of output power of an output unit of the light output device.

BACKGROUND

Japanese unexamined patent application publication No. JP-A-2007-42795 (Patent Document 1) describes a related art light output device. For example, Patent Document 1 discloses the related art light output device that is configured to control the output power of a laser diode of a light output unit thereof. It discloses an art to shorten the time required for intensity detection of a laser beam for controlling the output power of a laser diode.

Also, APC (Auto Power Control) has been performed as control of the output power of a laser diode. In the APC, usually the output power is detected and a control voltage signal for controlling the output power to a predetermined value is generated based on the detection result of the output power. The control voltage signal is converted into a drive current of the laser diode by a voltage-current conversion unit.

SUMMARY

However, the related art light output device has a few disadvantages. For example, as the start characteristic of the laser diode, the drive current of the laser diode and the output power have the following relationship: Laser emission is not normally pumped until the drive current becomes a predetermined drive current (threshold current), and the output power increases only a little. When the drive current exceeds the threshold current, rapidly the output power increases. As the temperature characteristic of the laser diode, usually the threshold current and the drive current increase with a rise in the ambient temperature.

Therefore, it is necessary to be made possible to control a large current value relative to the input voltage (control voltage) of the voltage-current conversion unit. At the time, the drive current fluctuates largely with slight fluctuation of the control voltage and it is feared that the output power may becomes unstable.

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a light output device that can supply stable output power and an image forming apparatus including the light output device.

According to a first aspect of exemplary embodiments of the present invention, there is provided a light output device comprising: an output unit that includes a light source, the output unit configured to output light from the light source; a control voltage generation unit that is configured to detect output power of the light source, the control voltage generation unit configured to generate a control voltage for controlling a drive current of the light source in response to the output power; a control unit that is configured to set a target value of the output power, the control unit configured to control the control voltage generation unit so as to set the output power to the target value; a voltage-current conversion unit that is configured to convert the control voltage into the drive current, the voltage-current conversion unit configured to supply the drive current to the light source; a setting unit that is configured to set an inclination of a characteristic line of control voltage-drive current conversion in the voltage-current conversion unit; and an adjustment unit that is configured to adjust the voltage-current conversion unit such that the drive current becomes a target current value for setting the output power to the target value in a predetermined control voltage value on the characteristic line where the output power does not reach the target value, wherein the setting unit is configured to set the inclination of the characteristic line to a first inclination where the drive current does not reach a maximum current value larger than the target current value in a maximum voltage value of the control voltage, and wherein the control unit is configured to control the control voltage generation unit in a state in which the inclination of the characteristic line is set to the first inclination after the drive current is set to the target current value.

According to the above, the drive current is set to the target current value for setting the output power to the target value in the predetermined control voltage value on the characteristic line where the output power does not reach the target value. After this, the control voltage generation unit is controlled, namely, APC of output power is performed in a state in which the inclination of the characteristic line is set to the first inclination (smaller than the inclination in the APC in the related art). Thus, in the APC after the drive current reaches the target current value, the fluctuation amount of the drive current relative to a predetermined fluctuation amount of the control voltage can be decreased as compared with the APC along the characteristic line with a large inclination in the related art. Accordingly, LD light emission relative to fluctuation of the control voltage can be stabilized and highly accurate APC can be performed.

According to the present invention, the light output device can supply stable output power.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE PRESENT INVENTION

First Exemplary Embodiment

1. Configuration of Image Forming Apparatus

A first exemplary embodiment of the invention will be discussed with reference to FIGS. 1 to 5.

Figure 1:
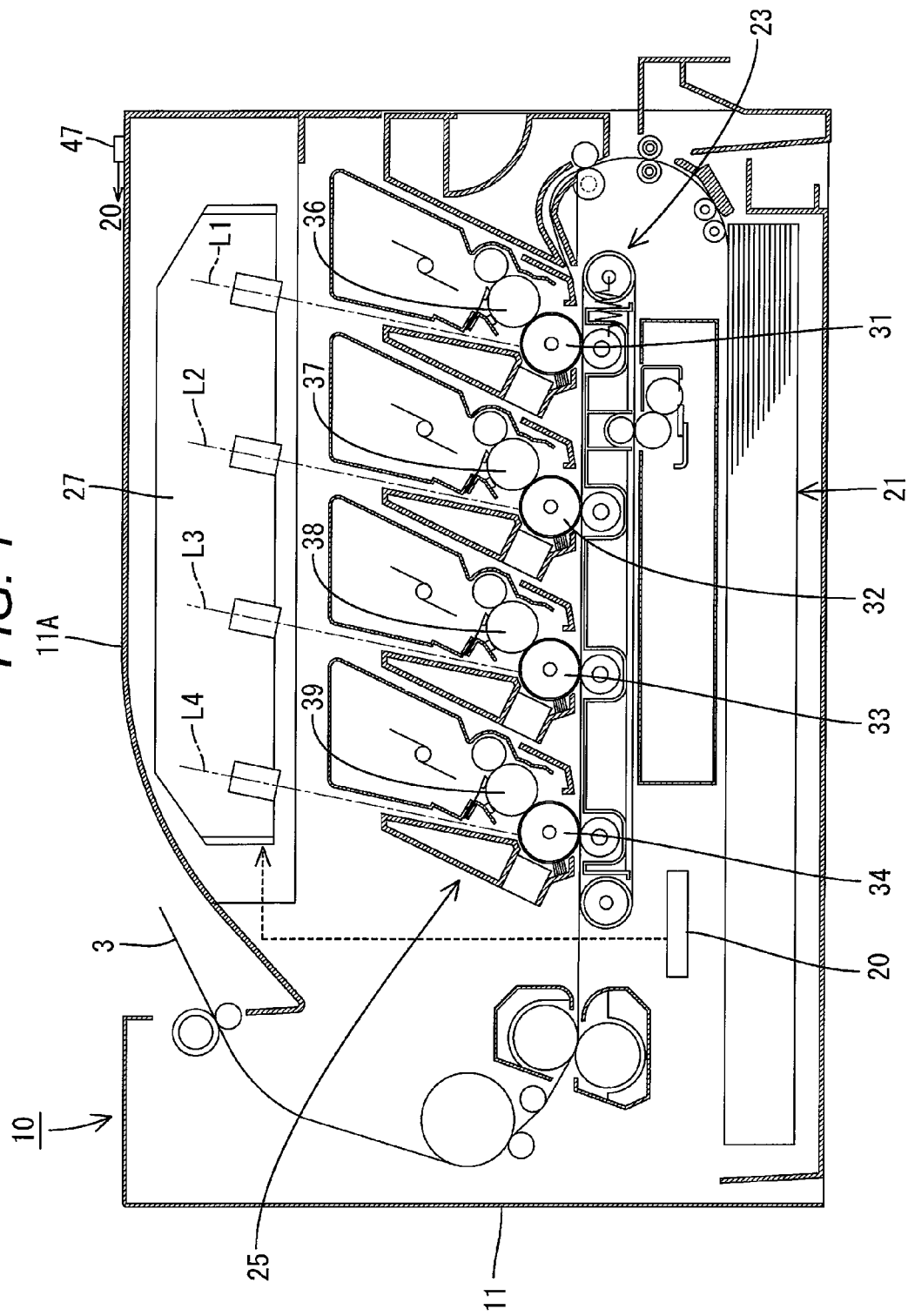
FIG. 1 is a sectional side view of the part according to a first exemplary embodiment of a laser printer.

FIG. 1 is a sectional side view of the part to schematically show the configuration according to the first exemplary embodiment of an image forming apparatus. Here, an example of applying the image forming apparatus to a laser printer 10 is shown.

The laser printer 10 is a color laser printer of direct tandem type including four photoconductive drums 31, 32, 33, and 34 and four developing rollers 36, 37, 38, and 39 corresponding to colors of black, cyan, magenta, and yellow. In the description to follow, it is assumed that the front indicates the right side of the plane of FIG. 1. The image forming apparatus may be not only a color laser printer, but also a monochrome laser printer or a multiple function device including a facsimile function and a copy function.

The laser printer 10 includes a main body casing 11. In this main body casing 11, a sheet feeding unit 21, a light output device 20, a sheet conveying unit 25 for conveying a sheet 3, an image forming unit 25 for forming an image using light output from the light output device 20, and a scanner unit 27 are stacked on each other in order from the bottom. The sheet conveying unit 25 contains the photoconductive drums 31, 32, 33, and 34, the developing rollers 36, 37, 38, and 39, and the like.

The scanner unit 27 has a polygon mirror and four laser diodes (an example of "light source") LD1 to LD4 included in the light output device 20 corresponding to the colors of black, cyan, magenta, and yellow. Laser light (an example of "light") L1 to L4 emitted from the laser diodes LD1 to LD4 are deflected by the polygon mirror. Then, L1 to L4 are changed in direction by optical components such as a reflecting mirror placed on an optical path and are applied to the surfaces of the photoconductive drums 31, 32, 33, and 34 in high-speed scanning as shown in FIG. 1. Accordingly, an electrostatic latent image is formed on each of the photoconductive drums 31 to 34. Then, the electrostatic latent image is subjected to a developing step, a transfer step, and a fixing step, whereby an image is formed on the sheet 3 conveyed on a conveying passage and the sheet 3 with the image formed thereon is discharged to a sheet discharging tray provided on an upper wall 11A of the main body casing 11.

2. Configuration of Light Output Device

Figure 2:
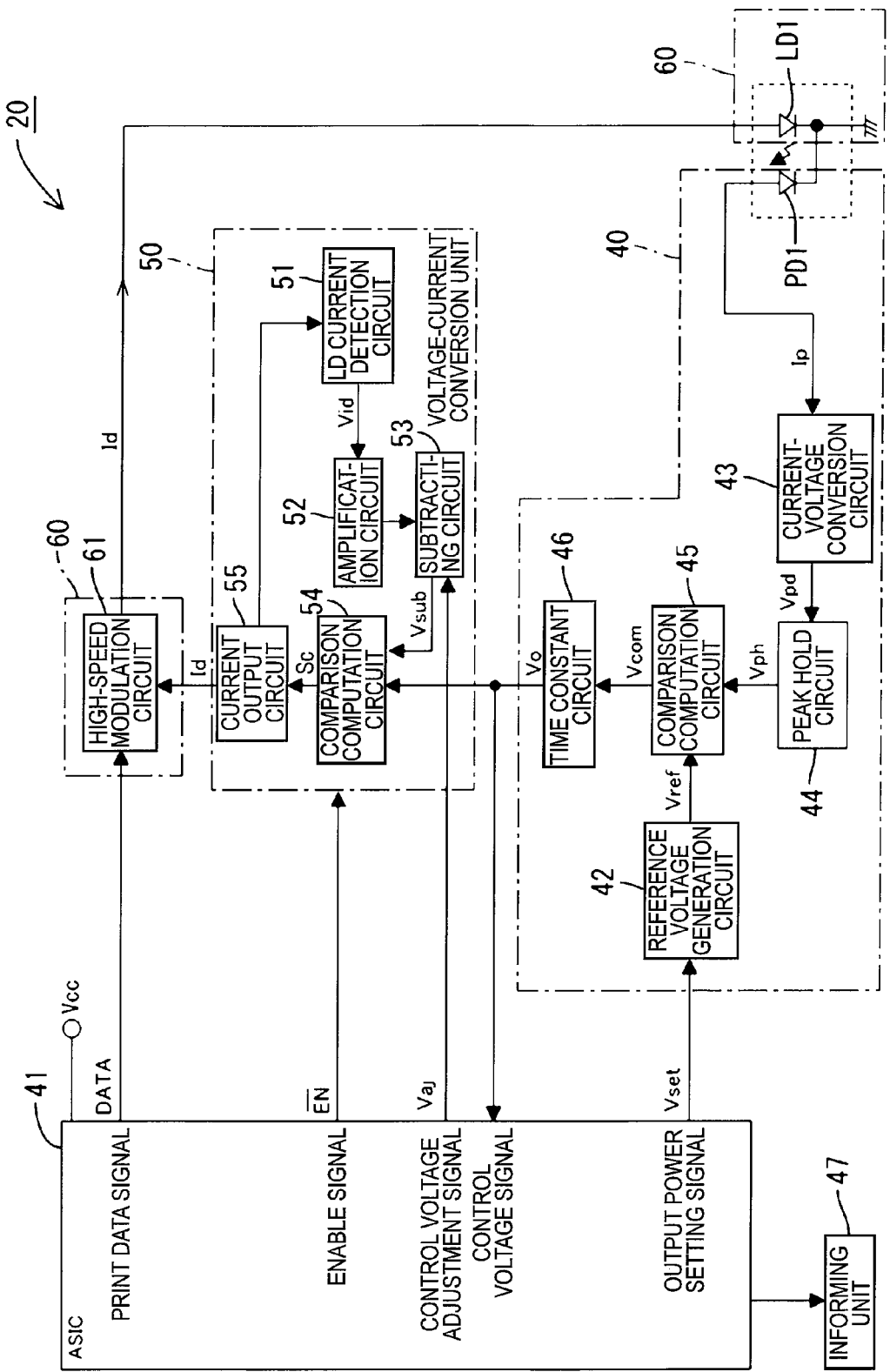
FIG. 2 is a block diagram of a light output device of the laser printer in the first exemplary embodiment.

Next, the circuit configuration of the light output device 20 according to the first exemplary embodiment will be discussed with reference to FIGS. 2 and 3. FIG. 2 is a schematic block diagram of the light output device 20 of the laser printer 10 in the first exemplary embodiment. Here, the light output device 20 is provided in the laser printer 10 (an example of image forming apparatus) by way of example.

The same circuit configuration of the light output device 20 except for a control circuit (an example of control unit, setting unit, and adjustment unit in the invention) 41 is provided for each of the four laser diodes LD1 to LD4 of the laser printer 10. Therefore, FIG. 2 shows only the configuration corresponding to the laser diode LD1. The control circuit 41 is shared among the laser diodes LD1 to LD4. The light output device 20 is not limited to the example wherein it is provided in the laser printer 10. The light source is not limited to the laser diodes LD1 to LD4 either.

The light output device 20 includes an output unit 60, the control circuit 41, a control voltage generation unit 40, an informing unit 47, and a voltage-current conversion circuit (an example of voltage-current conversion unit) 50.

The output unit 60 outputs the laser light L1 from the laser diode LD1. The control circuit 41 controls the output of the output unit 60. The control voltage generation unit 40 generates a control voltage (signal) Vo for maintaining the output power of the laser light L1 in a predetermined value. To gradually increase the output power of the laser light L1 when power supply (voltage) Vcc is turned on, the control voltage generation unit 40 generates the control voltage signal Vo so as to gradually rise, and supplies the generated control voltage signal Vo to the voltage-current conversion circuit 50 and the control circuit 41.

The configuration of the light output device 20 will be discussed below in more detail. As shown in FIG. 2, the output unit 60 includes a high-speed modulation circuit 61 and the laser diode LD1.

The control voltage generation unit 40 includes a light detection unit, a reference voltage generation circuit 42, a first comparison computation circuit 45, and a time constant circuit 46. The light detection unit generates a light detection signal (Ip, Vpd, Vph) responsive to the output power of the laser light L1 and includes a photodiode PD1, a current-voltage conversion circuit 43, and a peak hold circuit 44.

The photodiode PD1 receives laser light from the laser diode LD1, generates a light detection current (signal) Ip conforming to the value of the light intensity of the laser light, and outputs the light detection current Ip to the current-voltage conversion circuit 43. The photodiode PD1 is sealed in the same package as the laser diode LD1, for example, and a cathode of the laser diode LD1 and a cathode of the photodiode PD1 are connected to ground.

The current-voltage conversion circuit 43 receives the light detection current Ip, converts the light detection current Ip into a light detection voltage (signal) Vpd, and supplies the light detection voltage signal Vpd to the peak hold circuit 44. The current-voltage conversion circuit 43 is implemented as one resistor R4 connected between ground and an anode of the photodiode PD1, for example, as shown in FIG. 3.

The peak hold circuit 44 receives the light detection voltage signal Vpd and holds the peak value of the signal for a predetermined time. As shown in FIG. 3, the peak hold circuit 44 includes an operational amplifier (op-amp) OP2, for example, and receives the light detection voltage signal Vpd at a non-inversion input terminal. An anode of a diode D1 is connected to an output terminal of the op-amp OP2 and a cathode of the diode D1 is connected to an inversion input terminal of the op-amp OP2. A capacitor C3 and a resistor R3 are further connected to the cathode of the diode D1 and opposite terminals of the capacitor C3 and the resistor R3 are connected to ground. According to the configuration of the peak hold circuit 44, while the capacitor C3 is charged, the peak value of the light detection voltage signal Vpd is held and a hold voltage (signal) Vph is formed at a terminal of the capacitor C3 connected to the cathode of the diode D1. The hold voltage signal Vph is supplied to the first comparison computation circuit 45.

The control circuit 41 is implemented as an ASIC (application-specific integrated circuit), for example. To control the output of the output unit 60 to a predetermined value, the control circuit 41 generates a voltage setting signal Vset for setting a reference voltage Vref, and supplies the voltage setting signal Vset to the reference voltage generation circuit 42. Here, the voltage setting signal Vset is a PWM (pulse width modulation) signal, for example. The pulse width of the PWM signal is set to a predetermined value, whereby the reference voltage Vref of the reference voltage generation circuit 42 is set and the output power of the laser diode LD1 is set. The operation of the voltage-current conversion circuit 50 is validated by an enable signal EN in response to a print request.

The reference voltage generation circuit 42 receives the voltage setting signal Vset and gradually raises the voltage setting signal Vset in accordance with a first time constant to generate the reference voltage Vref. The reference voltage Vref is supplied to the first comparison computation circuit 45. The reference voltage generation circuit 42 is made up of a resistor R1 and a capacitor C1, for example, as shown in FIG. 3.

The first comparison computation circuit 45 makes a comparison between the hold voltage (voltage of light detection signal) Vph and the reference voltage Vref and generates a comparison signal Vcom responsive to the difference therebetween. At the time, if the reference voltage Vref is larger than the hold voltage Vph, the first comparison computation circuit 45 generates a comparison signal Vcom having a value larger than the reference voltage Vref for increasing the output power of the laser light. On the other hand, if the reference voltage Vref is smaller than the hold voltage Vph, the first comparison computation circuit 45 generates a comparison signal Vcom having a value smaller than the reference voltage Vref for decreasing the output power of the laser light. The comparison signal Vcom is supplied to the time constant circuit 46. The first comparison computation circuit 45 includes an op-amp OP1 and resistors R5 and R6, for example, as shown in FIG. 3. The hold voltage Vph is supplied to an inversion input terminal of the op-amp OP1 through the resistor R5, and the reference voltage Vref is supplied to a non-inversion input terminal of the op-amp OP1. The resistor R6 is connected between output and the inversion input terminal of the op-amp OP1. The amplification degree of the op-amp OP1 is set by the resistors R5 and R6.

Figure 3:
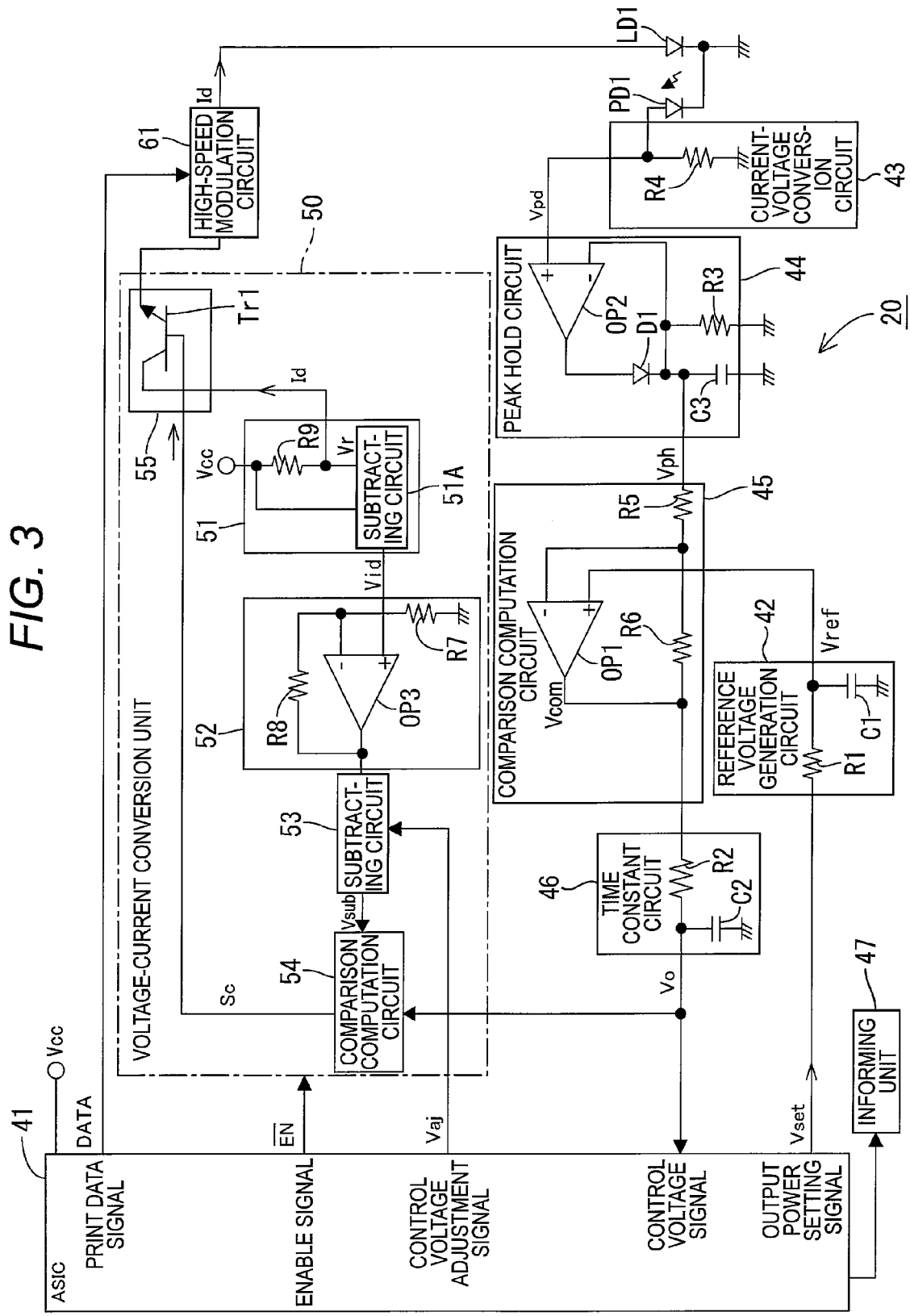
FIG. 3 is a schematic circuit diagram of the light output device in the first exemplary embodiment.

The time constant circuit 46 includes a resistor R2 and a capacitor C2 that form a second time constant, as shown in FIG. 3. The time constant circuit 46 receives the comparison signal Vcom from the first comparison computation circuit 45 and gradually raises the comparison signal Vcom in accordance with the second time constant to generate the control voltage signal Vo. The control voltage signal Vo is supplied to a second comparison computation circuit 54 of the voltage-current conversion circuit 50 and the control circuit 41.

The voltage-current conversion circuit 50 includes an LD current detection circuit (an example of setting unit) 51, an amplification circuit (an example of setting unit) 52, a subtracting circuit 53, the above-mentioned second comparison computation circuit 54, and a current output circuit 55.

The LD current detection circuit 51 includes a subtracting circuit 51A and a resistor R9 and detects an LD drive current Id supplied from power supply Vcc and generates a current detection signal Vid. The relation among the resistor R9, the LD drive current Id, and the current detection signal Vid is indicated by the following expression 1:

$$Vid = Vcc - Vr = Id \times R9 \qquad \text{Expression 1}$$

where Vr is voltage of the resistor R9 on the opposite side to the power supply Vcc. The current detection signal Vid is proportional to the LD drive current Id as shown in expression 1. That is, the LD current detection circuit 51 indirectly detects the LD drive current Id as the current detection signal Vid. The current detection signal Vid is supplied to the amplification circuit 52.

The amplification circuit 52 includes an op-amp OP3 and resistors R7 and R8, for example. The amplification circuit 52 amplifies the current detection signal Vid to a predetermined magnitude according to the amplification degree determined by the ratio between the resistors R7 and R8. The amplified current detection signal Vid is supplied to the subtracting circuit 53.

The subtracting circuit 53 receives the amplified current detection signal Vid from the amplification circuit 52 and receives a control voltage adjustment signal (an example of adjustment signal) Vaj from the control circuit 41. The subtracting circuit 53 subtracts the control voltage adjustment signal Vaj from the amplified current detection signal Vid, generates a subtraction signal Vsub, and supplies the subtraction signal Vsub to the second comparison computation circuit 54.

The second comparison computation circuit 54 makes a comparison between the control voltage signal Vo from the time constant circuit 46 and the subtraction signal Vsub from the subtracting circuit 53 and generates an output control signal Sc responsive to the difference therebetween. The output control signal Sc is supplied to the current output circuit 55.

The current output circuit 55 contains a transistor Tr1, for example. The output control signal Sc is supplied to a base of the transistor Tr1. The transistor Tr1 supplies the LD drive current Id from the power supply Vcc through the resistor R9 to the high-speed modulation circuit 61 in response to the output control signal Sc.

The high-speed modulation circuit 61 modulates the LD drive current Id in response to a print data signal and supplies the modulated LD drive current Id to the laser diode LD1.

The informing unit 47 is implemented as a buzzer, a display, etc., for example, for informing the user of degradation of the laser diode LD1 in response to the determination of the control circuit 41. The informing unit 47 is provided on an operation panel of the main body casing 11 of the laser printer 10, for example.

3. Operation and Advantages of Light Output Device

Figure 4:
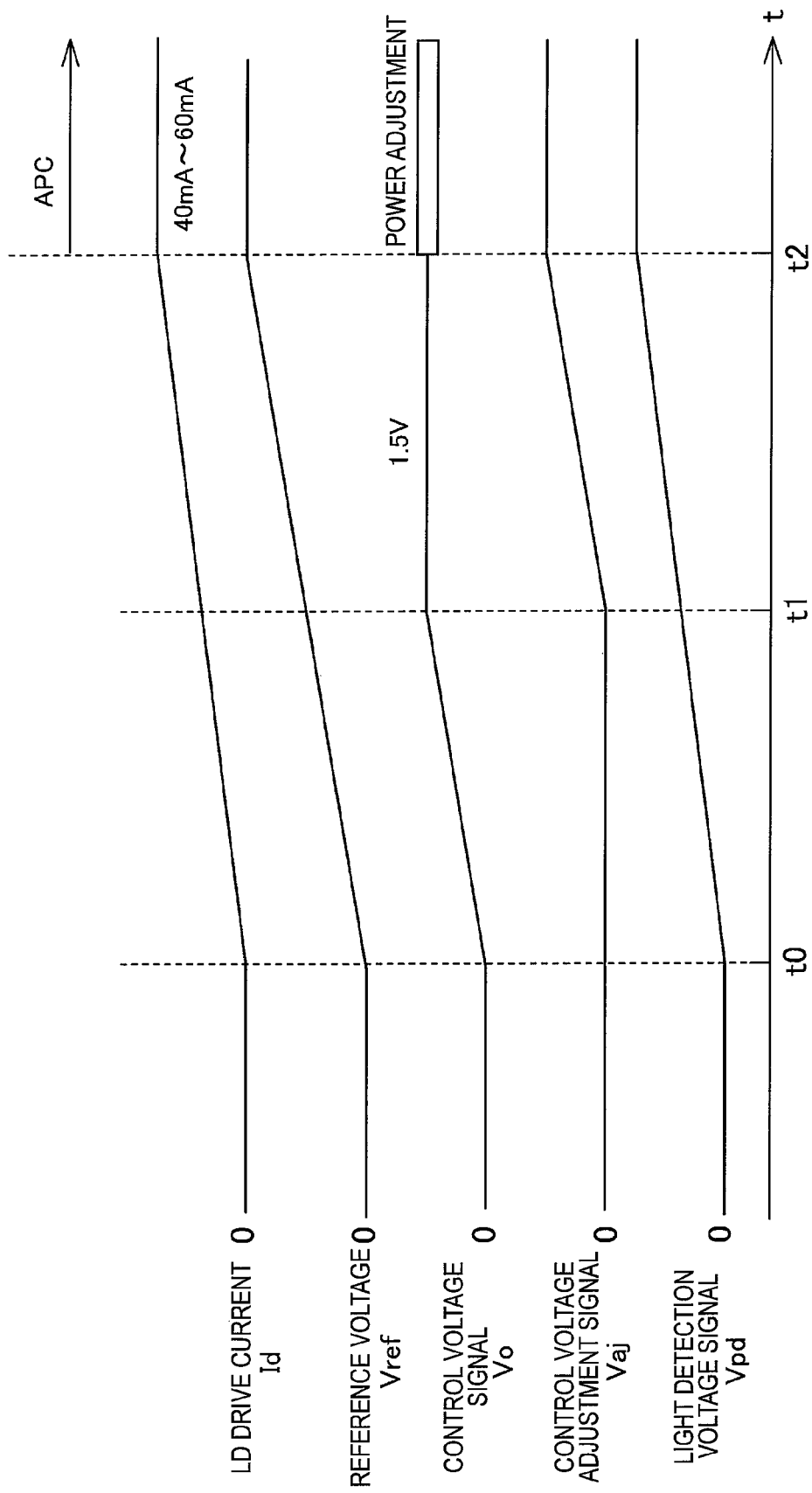
FIG. 4 is a time chart to show the progression of signals of the light output device in the first exemplary embodiment.

Next, the operation and the advantages of the described light output device will be discussed with reference to FIGS. 4 and 5. FIG. 4 is a time chart to show the progression of the various signals of the light output device, and FIG. 5 is a graph to show the relationship between the control voltage signal Vo and the LD drive current Id.

When the user makes a print request for the laser printer 10 and the laser diode LD1 is started at time t0 in FIG. 4, the reference voltage Vref gradually rises in accordance with the first time constant. Accordingly, the control voltage signal Vo also gradually rises in accordance with the second time constant. Accordingly, the LD drive current Id of the laser diode LD1 and the light detection voltage signal Vpd also gradually increase.

Figure 5:
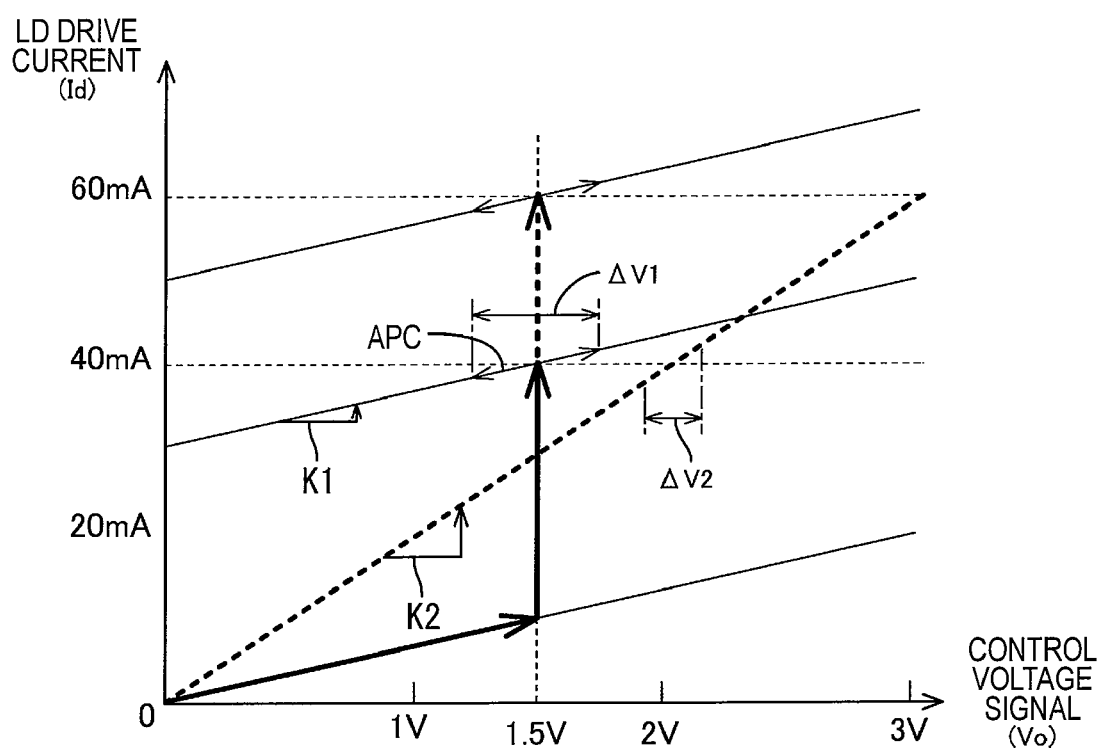
FIG. 5 is a graph to show the relationship between a control voltage signal and an LD drive current in the first exemplary embodiment.

The relationship between the control voltage signal Vo and the LD drive current Id at this time is indicated by the characteristic line of control voltage-drive current conversion (heavy solid line) in FIG. 5. An inclination K1 of the characteristic line is small as compared with an inclination K2 of a usual characteristic line (heavy dashed line). That is, the inclination K1 of the characteristic line is set to an inclination where the LD drive current Id does not reach a predetermined maximum value of the LD drive current Id (for example, 60 mA) in a predetermined maximum value of the control voltage signal Vo (for example, 3 V). The inclination K1 of the characteristic line is set by appropriately selecting the resistance values of the resistors R7, R8, and R9 of the voltage-current conversion circuit 50, for example.

When the control voltage signal Vo rises to a predetermined control voltage value, here, for example, 1.5 V at time t1 in FIG. 4, the control circuit 41 detects it. In response to the detection, to maintain the control voltage signal Vo at 1.5 V, the control circuit 41 generates a control voltage adjustment signal Vaj so as to gradually increase, and supplies the control voltage adjustment signal Vaj to the subtracting circuit 53. At this time, as the control voltage adjustment signal Vaj is supplied, the subtraction signal Vsub decreases. Accordingly, the output control signal Sc from the second comparison computation circuit 54 increases and the LD drive current Id also increases.

As the LD drive current Id increases, the light detection voltage signal Vpd, namely, the hold voltage Vph also increases. At this time, when the hold voltage Vph becomes larger than the reference voltage Vref, the comparison signal Vcom of the first comparison computation circuit 45, namely, the value of the control voltage signal Vo decreases.

Thus, after the time t1 in FIG. 4, the control circuit 41 increases the reference voltage Vref to increase the output power of the laser light and also increases the control voltage adjustment signal Vaj so as to maintain the control voltage Vo at 1.5 V while detecting the control voltage Vo.

At time t2 after a lapse of a predetermined time from the time t0, the control circuit 41 makes the control voltage adjustment signal Vaj constant at a predetermined value and after the time 2, performs APC of the output power of the laser light. The time 2, namely, the predetermined time from the time t0 is the time at which the LD drive current Id reaches a predetermined target current value and is previously determined by experiment, etc. The determining method of the time 2 is not limited to it. For example, the LD drive current Id reaching the predetermined target current value may be detected based on the voltage value of the light detection voltage signal Vpd and the time t2 may be determined according to the detection.

Thus, in the first exemplary embodiment, as shown in FIG. 5, first the inclination K1 of the characteristic line of control voltage-drive current conversion is set smaller than the inclination K2 of the usual characteristic line to allow the maximum current to flow. The control voltage adjustment signal Vaj is generated so that the LD drive current Id becomes the predetermined target current value (in FIG. 5, 40 mA) at the predetermined control voltage Vo (1.5 V in FIG. 5). After the LD drive current Id reaches the target current value (for example, 40 mA), APC control is performed along the characteristic line of the inclination K1.

Thus, as shown in FIG. 5, a control range ΔV1 of the control voltage Vo corresponding to the control range of a predetermined amount of the LD drive current Id becomes larger than a control range ΔV2 along the usual characteristic line of the inclination K2. In other words, the fluctuation amount of the LD drive current Id relative to a predetermined fluctuation amount of the control voltage Vo, namely, the fluctuation amount of the output power of the laser light can be decreased as compared with the APC along the usual characteristic line of the inclination K2. Thus, stable output power can be supplied as compared with the usual APC and highly accurate APC can be performed.

At the predetermined control voltage value, if the voltage value of the control voltage adjustment signal Vaj exceeds a predetermined maximum value, the control circuit 41 determines that the LD drive current Id becomes the predetermined maximum current value or more and the laser diode LD1 has degraded. Alternatively, at the predetermined control voltage value, if the voltage value of the control voltage adjustment signal Vaj becomes the predetermined maximum value and the control voltage Vo exceeds the predetermined maximum value, the control circuit 41 determines that the LD drive current Id becomes the predetermined maximum current value or more and the laser diode LD1 has degraded. If the control circuit 41 determines that the laser diode LD1 has degraded, the control circuit 41 generates an informing signal and supplies the informing signal to the informing unit 47 for informing the user that the laser diode LD1 has degraded. Thus, before degradation of the image quality or a failure of the LD driver, suitably degradation of the laser diode LD1 can be detected and the user can be informed that the laser diode LD1 has degraded.

Second Exemplary Embodiment

Figure 6:
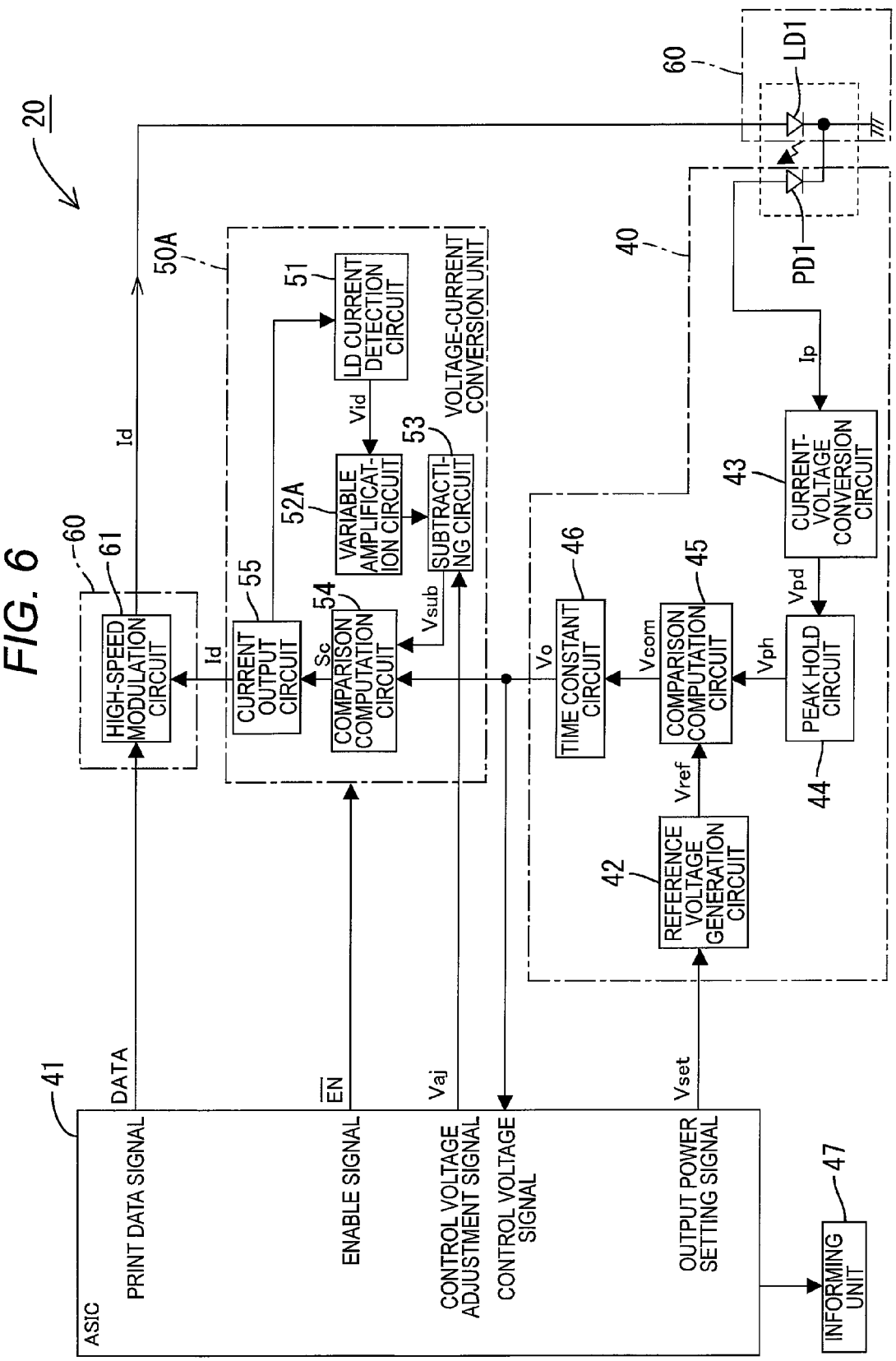
FIG. 6 is a block diagram of a light output device of a laser printer in a second exemplary embodiment.
Figure 7:
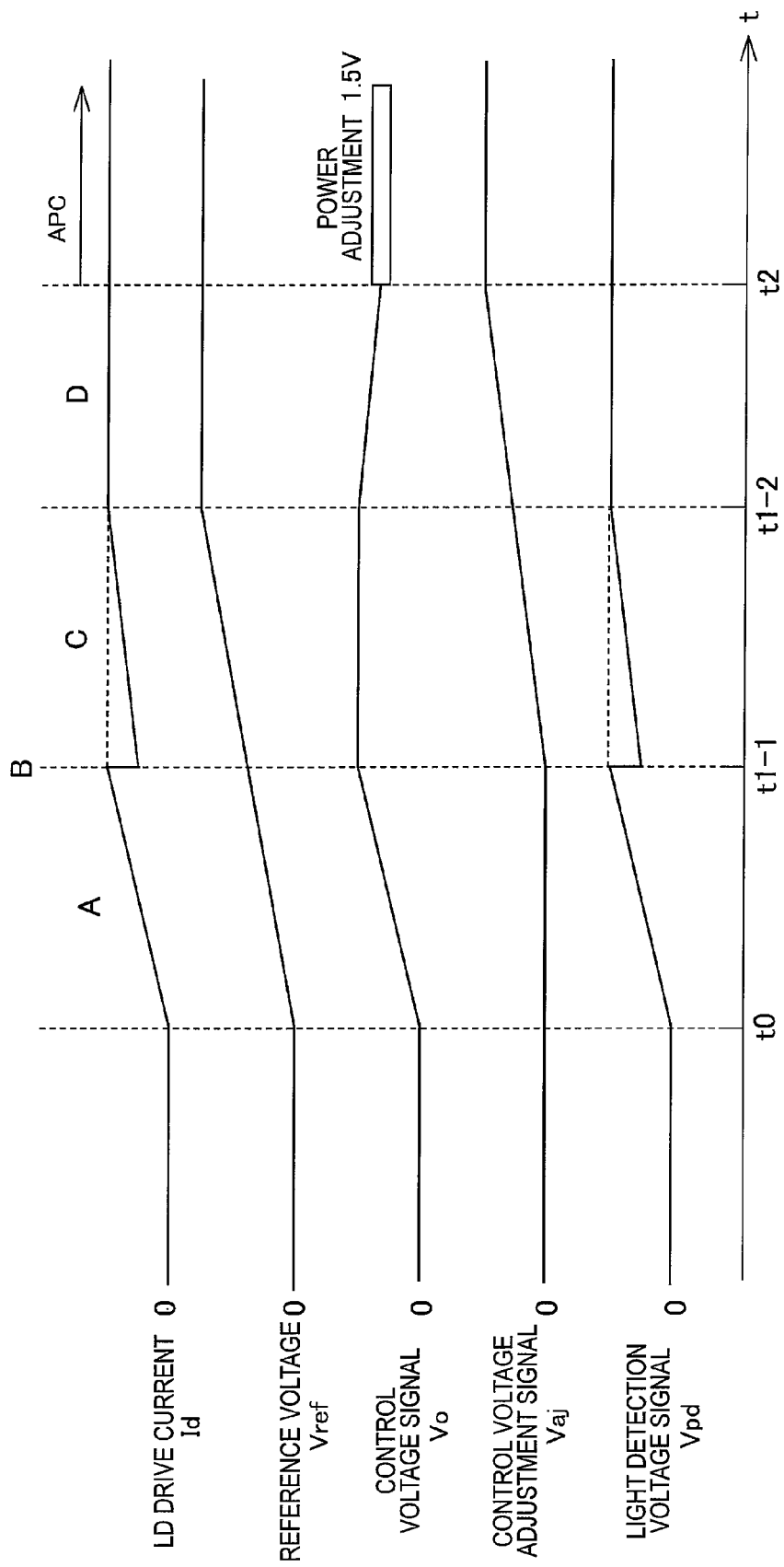
FIG. 7 is a time chart to show the progression of signals of the light output device in the second exemplary embodiment.
Figure 8:
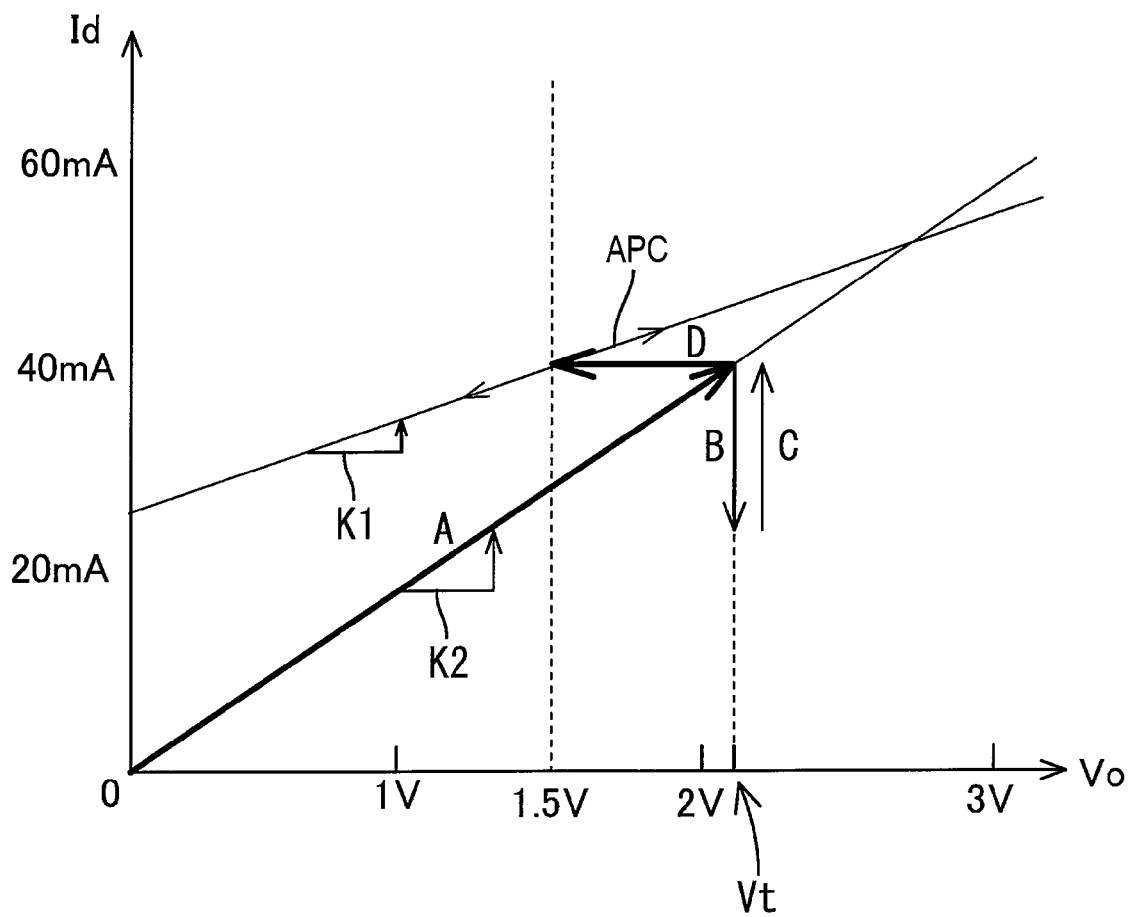
FIG. 8 is a graph to show the relationship between a control voltage signal and an LD drive current of the light output device in the second exemplary embodiment.

Next, a second exemplary embodiment of the invention will be discussed with reference to FIGS. 6 to 8. FIG. 6 is a schematic block diagram of a light output device 20 of a laser printer 10 in the second exemplary embodiment. FIG. 7 is a time chart to show the progression of various signals of the light output device, and FIG. 8 is a graph to show the relationship between a control voltage signal Vo and an LD drive current Id in the second exemplary embodiment.

The first and second exemplary embodiments differ only in the configuration involved in control of output power of laser light according to control voltage Vo of the light output device 20. Thus, only the difference will be discussed below. Therefore, components identical with those of the first exemplary embodiment are denoted by the same reference numerals in FIGS. 6 to 8 and will not be discussed again.

As shown in FIG. 6, the light output devices 20 in the first and second exemplary embodiments differ only in that the light output device 20 in the second exemplary embodiment adopts a voltage-current conversion circuit 50A with a variable amplification circuit 52A to which the amplification circuit 52 of the voltage-current conversion circuit 50 shown in FIG. 2 is changed. In the second exemplary embodiment, the variable amplification circuit 52A is used to change the amplification factor for changing an inclination K of a characteristic line. Specifically, for example, a programmable digital potentiometer is used as at least either of the resistors R7 and R8 shown in FIG. 3. That is, the amplification factor of the variable amplification circuit 52A depends on (1+R8/R7). Thus, the ratio between the resistors R7 and R8 is changed for changing the amplification factor of the variable amplification circuit 52A.

Next, control of output power of laser light in the second exemplary embodiment will be discussed with reference to FIGS. 7 and 8.

When the user makes a print request for the laser printer 10 and a laser diode LD1 is started at time t0 in FIG. 7 as in the first exemplary embodiment, a reference voltage Vref gradually rises in accordance with a first time constant. Accordingly, a control voltage signal Vo also gradually rises in accordance with a second time constant. Accordingly, an LD drive current Id and a light detection voltage signal Vpd of the laser diode LD1 also gradually increase (see symbol A in FIG. 7.)

The relationship between the control voltage signal Vo and the LD drive current Id at this time is indicated by an arrow A on the characteristic line of control voltage-drive current conversion (heavy solid line) in FIG. 8. As shown in FIG. 8, in the second exemplary embodiment, first an inclination K of the characteristic line of control voltage-drive current conversion is set to an inclination K2 of a usual characteristic line to allow the maximum current (for example, 60 mA) to flow by appropriately selecting the values of the resistors R7 and R8.

At time (t1-1) in FIG. 7 after a lapse of a predetermined time from the time t0, when the LD drive current Id reaches a predetermined target current value, for example, 40 mA, the control circuit 41 changes so as to increase the setup value of the resistor R8, for example, a programmable digital potentiometer of the variable amplification circuit 52A to change the inclination K of the characteristic line of control voltage-drive current conversion to an inclination K1 smaller than the inclination K2 of the usual characteristic line. To change the inclination K of the characteristic line from the inclination K2 to the inclination K1, the setup value of the resistor R7 may be decreased instead of increasing the setup value of the resistor R8 or the resistor R9 shown in FIG. 3 may be implemented as a programmable digital potentiometer and the value of the resistor R9 may be increased.

The time (t1-1) is previously determined by experiment, etc., as the time at which the LD drive current Id reaches a predetermined target current value. The determining method of the time (t1-1) is not limited to it. For example, the LD drive current Id reaching the predetermined target current value may be detected based on the voltage value of the light detection voltage signal Vpd and the time (t1-1) may be determined according to the detection.

The inclination K of the characteristic line at the time (t1-1) is changed, whereby the LD drive current Id decreases as indicated by a symbol B in FIG. 7 and an arrow B in FIG. 8. At this time, to increase the decreased LD drive current Id to the target current value, for example, 40 mA without changing a target voltage value Vt of the control voltage signal Vo corresponding to the target current value, the control circuit 41 gradually increases the reference voltage Vref and a control voltage adjustment signal Vaj (corresponding to an adjustment signal in the invention) (see a symbol C in FIG. 7 and an arrow C in FIG. 8). After the time (t1-1), when increasing the control voltage adjustment signal Vaj, the control circuit 41 changes the voltage value of the control voltage adjustment signal Vaj in response to the detection value of the control voltage Vo. In the interval to time (t1-2) in FIG. 7, the same control as at the interval from the time t1 to the time t2 in FIG. 4 in the first exemplary embodiment is performed. That is, the control circuit 41 increases the control voltage adjustment signal Vaj so as to maintain the control voltage Vo at a constant value while detecting the control voltage Vo.

When the LD drive current Id reaches the target current value at the time (t1-2) in FIG. 7, to decrease the control voltage Vo to a predetermined control voltage value, for example, 1.5 V while maintaining the LD drive current Id at the target current value, the control circuit 41 makes the reference voltage Vref constant and further gradually increases the control voltage adjustment signal Vaj (see a symbol D in FIG. 7 and an arrow D in FIG. 8). At this time, the LD drive current Id temporarily increases as the control voltage adjustment signal Vaj increases, and the light detection voltage signal Vpd increases as the LD drive current Id increases. Accordingly, a comparison signal Vcom of a first comparison computation circuit 45, namely, the value of the control voltage signal Vo decreases. As the control voltage signal Vo decreases, the increase in the LD drive current Id is suppressed. Thus, the control circuit 41 can decrease the control voltage Vo while maintaining the LD drive current Id almost constant by rightsizing the increasing degree of the control voltage adjustment signal Vaj in response to the detection value of the control voltage Vo.

The time (t1-2) is the time at which the LD drive current Id again reaches the predetermined target current value and is previously determined by experiment, etc. Alternatively, the LD drive current Id reaching the target current value may be detected based on the voltage value of the light detection voltage signal Vpd and the time (t1-2) may be determined according to the detection.

When the control voltage Vo reaches the control voltage signal Vo (1.5 V) at time t2 in FIG. 7, after the time t2, the control circuit 41 performs APC of the output power of the laser light along the characteristic line of control voltage-drive current conversion of the inclination K1 smaller than the inclination of the usual characteristic line as in the first exemplary embodiment with the predetermined control voltage value (1.5 V) as the center value of the control voltage signal Vo. The predetermined control voltage value is set to an intermediate value (in FIG. 8, 1.5 V) between the lower limit value (in FIG. 8, 0 V) and the upper limit value (in FIG. 8, 3 V) of the control voltage Vo. Thus, highly accurate APC can be performed suitably corresponding to a wide range of target drive current. The predetermined control voltage value is not limited to the intermediate value and may be a value almost close to the intermediate value.

Therefore, according to the configuration of the second exemplary embodiment, the fluctuation amount of the LD drive current Id relative to a predetermined fluctuation amount of the control voltage Vo, namely, the fluctuation amount of the output power of the laser light can also be decreased as compared with the APC along the usual characteristic line of the inclination K2 in the light power control of the laser light after the LD drive current Id reaches the target current value as in the first exemplary embodiment. Thus, stable output power can be supplied as compared with the usual APC and highly accurate APC can be performed.

Third Exemplary Embodiment

Figure 9:
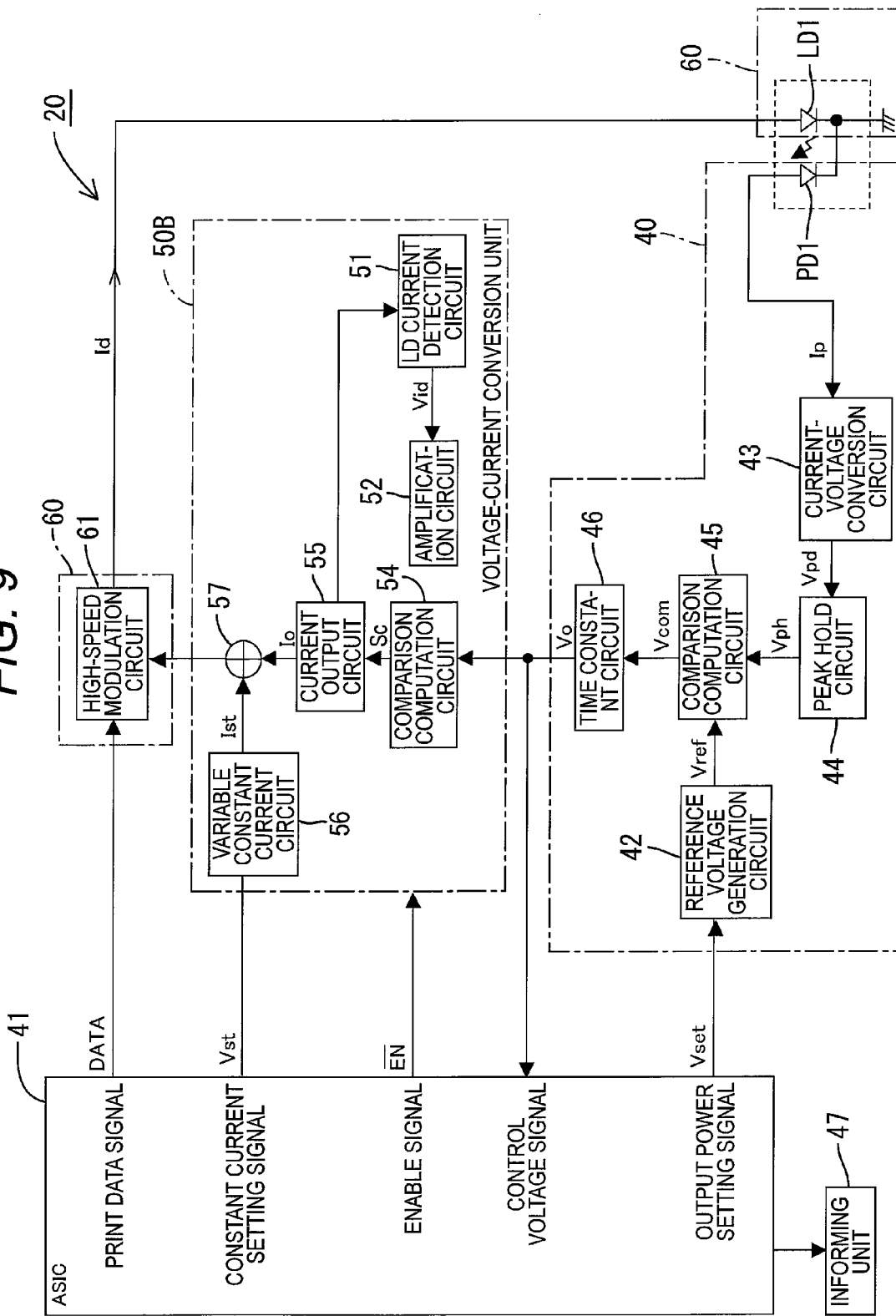
FIG. 9 is a block diagram of a light output device of a laser printer in a third exemplary embodiment of the invention.
Figure 10:
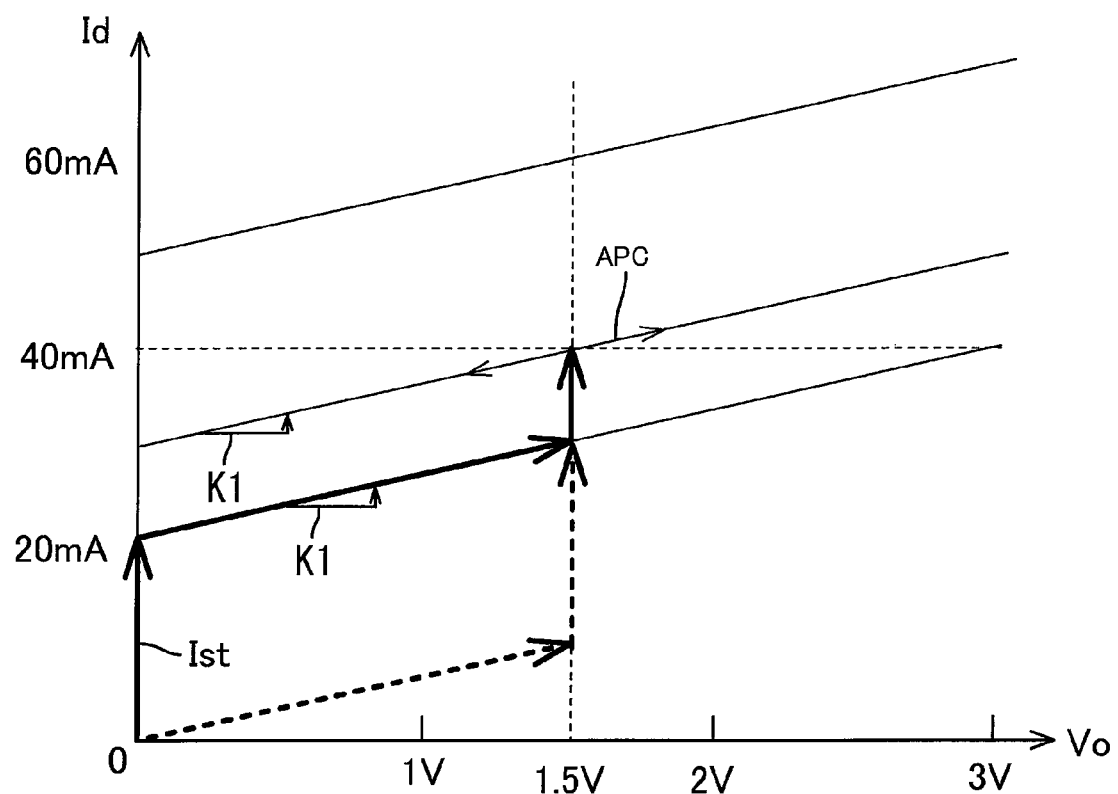
FIG. 10 is a graph to show the relationship between a control voltage signal and an LD drive current of the light output device in the third exemplary embodiment.

Next, a third exemplary embodiment of the invention will be discussed with reference to FIGS. 9 and 10. FIG. 9 is a schematic block diagram of a light output device 20 of a laser printer 10 in the third exemplary embodiment. FIG. 10 is a graph to show the relationship between a control voltage signal Vo and an LD drive current Id in the third exemplary embodiment.

The first and third exemplary embodiments differ only in the configuration involved in control of output power of laser light according to control voltage Vo of the light output device 20. Thus, only the difference will be discussed below. Therefore, components identical with those of the first exemplary embodiment are denoted by the same reference numerals in FIGS. 9 and 10 and will not be discussed again.

As shown in FIG. 9, the light output devices 20 in the first and third exemplary embodiments differ in that the light output device 20 in the third exemplary embodiment adopts a voltage-current conversion circuit 50B with the subtracting circuit 53 omitted in the voltage-current conversion circuit 50 of the first exemplary embodiment (see FIG. 2) and a variable constant current circuit 56 and a current adder 57 added to the voltage-current conversion circuit 50.

Next, control of output power of laser light in the third exemplary embodiment will be discussed with reference to FIG. 10. In the third exemplary embodiment, as shown in FIG. 10, first an inclination K of the characteristic line of control voltage-drive current conversion is set to an inclination K1 smaller than an inclination K2 of a usual characteristic line to allow the maximum current (for example, 60 mA) to flow as the first exemplary embodiment.

At the time, a control circuit 41 supplies a constant current setting signal Vst for a constant current (corresponding to a start constant current) Ist in a range in which LD does not emit light (for example, about 20 mA as shown in FIG. 10) or a constant current (corresponding to a start constant current) Ist in a range in which desired output power is not produced (for example, 30 mA) to the variable constant current circuit 56. The variable constant current circuit 56 supplies the constant current Ist (an example of adjustment signal) to the current adder 57, which then adds the constant current Ist and an output current Io from a current output circuit 55 to generate an LD drive current Id.

After the control voltage Vo reaches a predetermined control voltage value (for example, 1.5V), the variable constant current circuit 56 gradually increases (varies) the constant current Ist until a target drive current (for example, 40 mA in FIG. 9) Id in accordance with the constant current setting signal Vst so that the control voltage Vo holds the predetermined control voltage value.

After the LD drive current Id becomes the target current value (40 mA), the control circuit 41 performs APC of the output power of the laser light along the characteristic line of control voltage-drive current conversion of the inclination K1 as in the first exemplary embodiment with the predetermined control voltage value (1.5 V) as the center value.

Therefore, according to the configuration of the third exemplary embodiment, the fluctuation amount of the LD drive current Id relative to a predetermined fluctuation amount of the control voltage Vo, namely, the fluctuation amount of the output power of the laser light can also be decreased as compared with the APC along the usual characteristic line of the inclination K2 in the light power control of the laser light after the LD drive current Id reaches the target current value as in the first exemplary embodiment. Thus, stable output power can be supplied as compared with the usual APC and highly accurate APC can be performed.

Further, the LD drive current Id can be promptly increased to the target current value and can be made to converge thereon as compared with the case where the LD drive current Id is generated from zero.

In the third exemplary embodiment, if the current value of the constant current Ist exceeds the predetermined maximum value, the control circuit 41 determines that the LD drive current Id becomes the predetermined maximum current value or more and laser diode LD1 has degraded, and informs the user that the laser diode LD1 has degraded through an information unit 47.

In the third exemplary embodiment, without supplying the constant current Ist to the current adder 57 from the beginning, the constant current Ist may be varied and supplied to the current adder 57 to provide the target drive current after the control voltage Vo reaches the predetermined control voltage value (1.5 V) as indicated by the dashed line in FIG. 10.

Further, in the third exemplary embodiment, the subtracting circuit 53 of the first exemplary embodiment may be included and the constant current Ist may be supplied and after the control voltage Vo reaches the predetermined control voltage value (1.5 V), the control voltage adjustment signal Vaj may be supplied to the subtracting circuit 53 to provide the target drive current as in the first exemplary embodiment.

Other Embodiments

It is to be understood that the invention is not limited to the embodiments described with reference to the accompanying drawings and the following embodiment, for example, is also contained in the technical scope of the invention and further in addition, the invention can be embodied in various modified forms without departing from the scope and the spirit of the invention.

Figure 11:
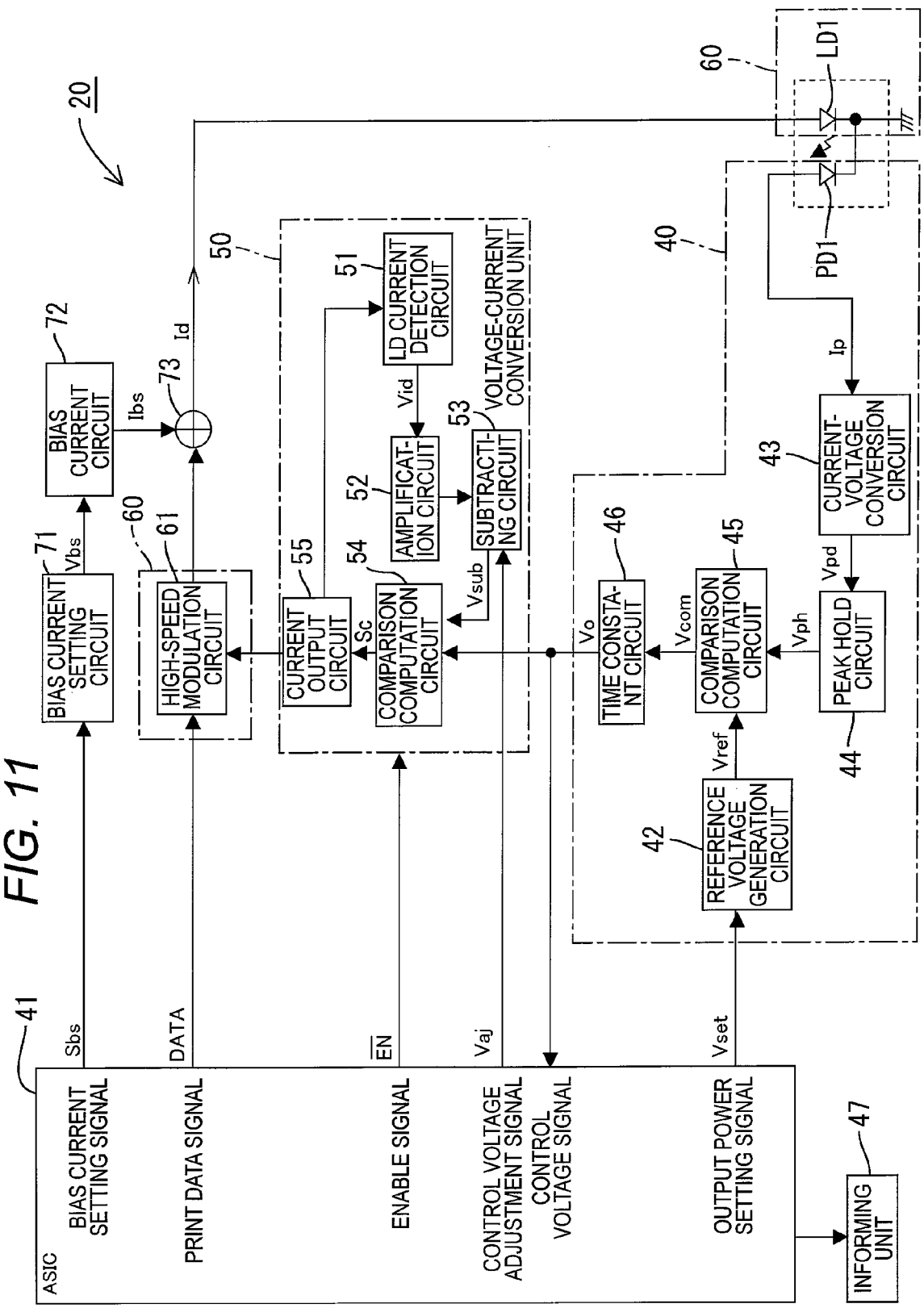
FIG. 11 is a block diagram of a light output device of a laser printer of another embodiment.

(1) In the embodiments described above, the light output device 20 may further include a bias current setting circuit 71, a bias current circuit 72, and a current adder 73 as shown in FIG. 11. In this configuration, the control circuit 41 estimates the LD drive current Id based on the control voltage Vo and the control voltage adjustment signal (adjustment signal) Vaj. To apply the added components to the third exemplary embodiment, the LD drive current Id is estimated based on the control voltage Vo and the constant current (adjustment signal) Ist (see FIG. 9).

The control circuit 41 generates a bias current setting signal Sbs to change setting of a bias current Ibs of the laser diode LD1 in response to the estimated LD drive current Id, and supplies the bias current setting signal Sbs to the bias current setting circuit 71. The bias current setting circuit 71 generates a bias current setting voltage Vbs based on the bias current setting signal Sbs. The bias current circuit 72 generates a predetermined bias current Ibs in response to the bias current setting voltage Vbs and supplies the bias current Ibs to the current adder 73. The current adder 73 supplies the LD drive current Id with the bias current Ibs superposed thereon to the laser diode LD1. Here, it is assumed that the bias current setting voltage Vbs and the bias current Ibs have proportionality.

In this case, setting of the bias current Ibs may be changed (switched) at any time in response to the estimated LD drive current Id. Alternatively, setting of the bias current Ibs may be changed (switched) before print or between print sheets to prevent an image from being abruptly switched at a midpoint.

Thus, the usually fixed bias current Ibs is rightsized in response to the LD drive current Id in any desired output power, whereby the LD output pulse width relative to the input pulse width to the laser diode LD1 becomes stable and the image quality can be enhanced. Thus, for example, the effect of change in the ambient temperature on the image quality can also be decreased. That is, the LD drive current-laser output characteristic dependent on the ambient temperature can be suitably covered by changing the bias current Ibs.

According to a first aspect of the exemplary embodiments, the output device comprises an output unit having a light source for outputting light from the light source; a control voltage generation unit for detecting output power of the light source and generating a control voltage for controlling a drive current of the light source in response to the output power; a control unit for setting a target value of the output power and controlling the control voltage generation unit so as to set the output power to the target value; a voltage-current conversion unit for converting the control voltage into the drive current and supplying the provided drive current to the light source; a setting unit for setting an inclination of a characteristic line of control voltage-drive current conversion in the voltage-current conversion unit; and an adjustment unit for adjusting the voltage-current conversion unit so that the drive current becomes a target current value for setting the output power to the target value in a predetermined control voltage value on the characteristic line where the output power does not reach the target value, wherein the setting unit can set the inclination of the characteristic line to a first inclination where the drive current does not reach the maximum current value larger than the target current value in the maximum voltage value of the control voltage, and wherein the control unit controls the control voltage generation unit in a state in which the inclination of the characteristic line is set to the first inclination after the drive current is set to the target current value.

According to the first aspect of the exemplary embodiments, the drive current is set to the target current value for setting the output power to the target value in the predetermined control voltage value on the characteristic line where the output power does not reach the target value. After this, the control voltage generation unit is controlled, namely, APC of output power is performed in a state in which the inclination of the characteristic line is set to the first inclination (smaller than the inclination in the APC in the related art). Thus, in the APC after the drive current reaches the target current value, the fluctuation amount of the drive current relative to a predetermined fluctuation amount of the control voltage can be decreased as compared with the APC along the characteristic line with a large inclination in the related art. Accordingly, LD light emission relative to fluctuation of the control voltage can be stabilized and highly accurate APC can be performed.

As a second aspect of the exemplary embodiments, in the light output unit of the first aspect, the control unit controls the voltage-current conversion unit so that the control voltage and the drive current change along the characteristic line of the first inclination after the control starts, and the adjustment unit generates an adjustment signal for increasing the drive current to the target current value while maintaining the control voltage at the predetermined control voltage value after the control voltage reaches the predetermined control voltage value.

According to the second aspect of the exemplary embodiments, the drive current can be suitably increased to the target current value while the control voltage is maintained at the predetermined control voltage value by the adjustment signal.

As a third aspect of the exemplary embodiments, in the light output unit of the second aspect, the adjustment signal is a voltage signal, and after the control voltage reaches the predetermined voltage value, the adjustment unit gradually raises the voltage value of the adjustment signal, thereby causing the drive current to reach the target current value.

According to the third aspect, the drive current can be suitably increased to the target current value after while the control voltage reaches the predetermined control voltage value.

As a fourth aspect of the exemplary embodiments, in the light output unit of the first aspect, the setting unit sets the inclination of the characteristic line to a second inclination larger than the first inclination where the drive current reaches a predetermined maximum value in the predetermined maximum value of the control voltage, the control unit controls the voltage-current conversion unit so that the control voltage and the drive current change along the characteristic line of the second inclination after the control starts, when the control voltage reaches the target voltage value to provide the target value of the output power, the setting unit changes setting of the inclination of the characteristic line from the second inclination to the first inclination, and the adjustment unit generates an adjustment signal for causing the control voltage to make a transition from the target voltage value to the predetermined control voltage value and supplies the adjustment signal to the voltage-current conversion unit.

According to the fourth aspect, when the control voltage reaches the target voltage value to provide the target value of the output power, setting of the inclination of the characteristic line is changed to the first inclination smaller than the second inclination. After this, APC can be suitably performed based on the first inclination in the predetermined control voltage value where the control voltage is smaller than the target voltage value.

As a fifth aspect of the exemplary embodiments, in the light output unit of the fourth aspect, the predetermined control voltage value is set to an intermediate value between the lower limit value and the upper limit value of the control voltage.

According to the fifth aspect, APC of the drive current is performed along the characteristic line of control voltage-drive current conversion in the intermediate value between the lower limit value and the upper limit value of the control voltage. Thus, suitable APC can be performed covering a wide range of target drive current. The "intermediate value" also contains a value in the proximity of the intermediate value.

As a sixth aspect of the exemplary embodiments, in the light output unit of the fourth or fifth aspect, the adjustment unit determines the magnitude of the adjustment signal in response to the control value.

According to the sixth aspect, control when the control voltage is caused to make a transition from the target voltage value to the predetermined control voltage value can be performed suitably.

As a seventh aspect of the exemplary embodiments, the light output unit of any of the second to sixth aspects further includes an informing unit for informing a user of degradation of the light source, wherein if the voltage value of the adjustment signal exceeds a predetermined maximum value in the predetermined control voltage value, the control unit determines that the drive current becomes the predetermined maximum value or more and the light source has degraded or if the voltage value of the adjustment signal becomes the predetermined maximum value in the predetermined control voltage value and the control voltage exceeds the predetermined maximum value, the control unit determines that the drive current becomes the predetermined maximum value or more and the light source has degraded, and wherein the informing unit informs the user of degradation of the light source in response to the determination of the control unit.

According to the seventh aspect, before degradation of the image quality or a failure of an LD driver, suitably degradation of the light source can be detected and the user can be informed that the light source has degraded.

As an eighth aspect of the exemplary embodiments, in the light output unit of the second aspect, the adjustment signal is a current signal, after the control voltage reaches the predetermined voltage value, the adjustment unit gradually raises the current value of the adjustment signal, thereby causing the drive current to reach the target current value, and the voltage-current conversion unit includes a current adding unit for adding the current value of the adjustment signal to the drive current when the control voltage reaches the predetermined voltage value to generate an addition drive current, and supplies the addition drive current to the light source.

According to the eighth aspect, after the control voltage reaches the predetermined control voltage value, the current value of the adjustment signal is simply gradually raised, whereby the drive current can be increased to the target current value suitably.

As a ninth aspect of the exemplary embodiments, in the light output unit of the eighth aspect, when the control unit starts control, the adjustment unit generates a start constant current and supplies the start constant current to the current adding unit, and the current adding unit starts supplying the addition drive current to the light source at the control start time.

According to the ninth aspect, the drive current can be promptly increased to the predetermined current value and can be made to converge thereon as compared with the case where the drive current is generated from zero.

As a tenth aspect of the exemplary embodiments, the light output unit of the eighth or ninth aspect further includes an informing unit for informing a user of degradation of the light source, wherein if the current value of the adjustment signal exceeds a predetermined maximum value, the control unit determines that the drive current becomes the predetermined maximum current value or more and the light source has degraded, and wherein the informing unit informs the user of degradation of the light source in response to the determination of the control unit.

According to the tenth aspect of the exemplary embodiments, before degradation of the image quality or a failure of the LD driver, suitably degradation of the light source can be detected and the user can be informed that the light source has degraded.

As an eleventh aspect of the exemplary embodiments, the light output unit of any one of the first to tenth aspects further includes a bias current circuit for generating a bias current added to the drive current for rightsizing the output power of the light source, wherein the control unit estimates the drive current based on the control voltage and the adjustment signal and generates a bias current setting signal to change setting of the bias current in response to the estimated drive current, and wherein the bias current circuit generates the bias current in response to the bias current setting signal.

According to the eleventh aspect, the bias current supplied to the light source can be rightsized in response to the drive current. Thus, to use the light output unit with an image formation apparatus, the formed image quality can be enhanced.

An image formation apparatus of a twelfth aspect of the exemplary embodiments includes a light output unit of any one of the first to eleventh aspects of the invention and an image forming unit for forming an image using the light output from the output unit of the light output unit.

According to the twelfth aspect, stable output power can be supplied and the image quality is enhanced.

What is claimed is:

1. A light output device comprising:
an output unit that includes a light source, the output unit configured to output light from the light source;
a control voltage generation unit that is configured to detect output power of the light source, the control voltage generation unit configured to generate a control voltage for controlling a drive current of the light source in response to the output power;
a control unit that is configured to set a target value of the output power, the control unit configured to control the control voltage generation unit so as to set the output power to the target value;
a voltage-current conversion unit that is configured to convert the control voltage into the drive current, the voltage-current conversion unit configured to supply the drive current to the light source;
a setting unit that is configured to set an inclination of a characteristic line of control voltage-drive current conversion in the voltage-current conversion unit; and
an adjustment unit that is configured to adjust the voltage-current conversion unit such that the drive current becomes a target current value for setting the output power to the target value in a predetermined control voltage value on the characteristic line where the output power does not reach the target value,
wherein
the setting unit is configured to set the inclination of the characteristic line to a first inclination where the drive current does not reach a maximum current value larger than the target current value in a maximum voltage value of the control voltage, and
wherein
the control unit is configured to control the control voltage generation unit in a state in which the inclination of the characteristic line is set to the first inclination after the drive current is set to the target current value.

2. The light output device according to claim 1,
wherein
the control unit is configured to control the voltage-current conversion unit such that the control voltage and the drive current change along the characteristic line of the first inclination after the control starts, and
wherein
the adjustment unit is configured to generate an adjustment signal for increasing the drive current to the target current value while maintaining the control voltage at the predetermined control voltage value after the control voltage reaches the predetermined control voltage value.

3. The light output device according to claim 2,
wherein
the adjustment signal is a voltage signal, and
wherein
after the control voltage reaches the predetermined voltage value, the adjustment unit gradually raises the voltage value of the adjustment signal, thereby causing the drive current to reach the target current value.

4. The light output device according to claim 2, further comprising:
an informing unit that is configured to inform a user of degradation of the light source,
wherein
if the voltage value of the adjustment signal exceeds a predetermined maximum value in the predetermined control voltage value, the control unit determines that the drive current becomes the predetermined maximum value or more and the light source has degraded or
if the voltage value of the adjustment signal becomes the predetermined maximum value in the predetermined control voltage value and the control voltage exceeds the predetermined maximum value, the control unit determines that the drive current becomes the predetermined maximum value or more and the light source has degraded, and
wherein
the informing unit is configured to inform the user of degradation of the light source in response to the determination of the control unit.

5. The light output device according to claim 2,
wherein the adjustment signal is a current signal,
wherein
after the control voltage reaches the predetermined voltage value, the adjustment unit gradually raises the current value of the adjustment signal, thereby causing the drive current to reach the target current value, and
wherein
the voltage-current conversion unit includes a current adding unit which is configured to add the current value of the adjustment signal to the drive current when the control voltage reaches the predetermined voltage value to generate an addition drive current, and which is configured to supply the addition drive current to the light source.

6. The light output device according to claim 5,
wherein
when the control unit starts control, the adjustment unit generates a start constant current and supplies the start constant current to the current adding unit, and
wherein
the current adding unit is configured to start supplying the addition drive current to the light source at the control start time.

7. The light output device according to claim 5, further comprising:
an informing unit that is configured to inform a user of degradation of the light source,
wherein
if the current value of the adjustment signal exceeds a predetermined maximum value, the control unit determines that the drive current becomes the predetermined maximum current value or more and the light source has degraded, and
wherein
the informing unit is configured to inform the user of degradation of the light source in response to the determination of the control unit.

8. The light output device according to claim 1,
wherein
the setting unit is configured to set the inclination of the characteristic line to a second inclination larger than the first inclination where the drive current reaches a predetermined maximum value in a predetermined maximum value of the control voltage,
wherein
the control unit is configured to control the voltage-current conversion unit such that the control voltage and the drive current change along the characteristic line of the second inclination after the control starts,
wherein
when the control voltage reaches a target voltage value in which the output power can reach the target value, the setting unit changes setting of the inclination of the characteristic line from the second inclination to the first inclination, and
wherein
the adjustment unit is configured to generate an adjustment signal for causing the control voltage to make a transition from the target voltage value to the predetermined control voltage value, the adjustment unit configured to supply the adjustment signal to the voltage-current conversion unit.

9. The light output device according to claim 8,
wherein
the predetermined control voltage value is set to an intermediate value between a lower limit value and an upper limit value of the control voltage.

10. The light output device according to claim 8,
wherein
the adjustment unit is configured to determine the magnitude of the adjustment signal in response to the control voltage.

11. The light output device according to claim 1, further comprising:
a bias current circuit that is configured to generate a bias current added to the drive current for rightsizing the output power of the light source,
wherein
the control unit is configured to estimate the drive current based on the control voltage and the adjustment signal, the control unit configured to generate a bias current setting signal to change setting of the bias current in response to the estimated drive current, and
wherein
the bias current circuit is configured to generate the bias current in response to the bias current setting signal.

12. An image forming apparatus comprising:
a light output device comprising:
an output unit that includes a light source, the output unit configured to output light from the light source;
a control voltage generation unit that is configured to detect output power of the light source, the control voltage generation unit configured to generate a control voltage for controlling a drive current of the light source in response to the output power;
a control unit that is configured to set a target value of the output power, the control unit configured to control the control voltage generation unit so as to set the output power to the target value;
a voltage-current conversion unit that is configured to convert the control voltage into the drive current, the voltage-current conversion unit configured to supply the drive current to the light source; and
a setting unit that is configured to set an inclination of a characteristic line of control voltage-drive current conversion in the voltage-current conversion unit; and
an adjustment unit that is configured to adjust the voltage-current conversion unit such that the drive current becomes a target current value for setting the output power to the target value in a predetermined control voltage value on the characteristic line where the output power does not reach the target value, and
an image forming unit that is configured to form an image using a light output from the output unit of the light output device,
wherein
the setting unit is configured to set the inclination of the characteristic line to a first inclination where the drive current does not reach a maximum current value larger than the target current value in a maximum voltage value of the control voltage, and
wherein
the control unit is configured to control the control voltage generation unit in a state in which the inclination of the characteristic line is set to the first inclination after the drive current is set to the target current value.

* * * * *